United States Patent
Chen et al.

(10) Patent No.: US 7,205,167 B2
(45) Date of Patent: Apr. 17, 2007

(54) METHOD TO DETECT PHOTORESIST RESIDUE ON A SEMICONDUCTOR DEVICE

(75) Inventors: To-Yu Chen, Tainan County (TW); Mei-Yen Li, Tainan County (TW); Yung-Lung Hsu, Tainan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 10/842,178

(22) Filed: May 10, 2004

(65) Prior Publication Data

US 2005/0250227 A1    Nov. 10, 2005

(51) Int. Cl.
*H01L 21/66* (2006.01)
(52) U.S. Cl. .......... 438/16; 257/E21.024; 257/E21.527
(58) Field of Classification Search .................. 438/16
See application file for complete search history.

(56) References Cited

U.S. PATENT DOCUMENTS

| | | | |
|---|---|---|---|
| 5,214,283 A | 5/1993 | Le | |
| 5,641,382 A | 6/1997 | Shih et al. | |
| 6,228,277 B1 | 5/2001 | Kornblit et al. | |
| 6,317,514 B1 * | 11/2001 | Reinhorn et al. | ........... 382/147 |
| 6,417,096 B1 | 7/2002 | Chen et al. | |
| 6,686,129 B2 | 2/2004 | Chang et al. | |
| 2004/0021076 A1 * | 2/2004 | Kadyshevitch et al. | ..... 250/310 |

OTHER PUBLICATIONS

"Webster's II, New College Dictionary", Houghton Mifflin Co., New York, 1995, p. 769.*

* cited by examiner

*Primary Examiner*—Alexander Ghyka
(74) *Attorney, Agent, or Firm*—Haynes and Boone, LLP

(57) ABSTRACT

A method for detecting photoresist residue during semiconductor device manufacture includes developing photoresist on a surface of a semiconductor device to expose portions of the surface A plurality of etch paths are then partially etched into the surface and inspected to determine their depths.

23 Claims, 5 Drawing Sheets

METHOD TO DETECT PHOTORESIST RESIDUE ON A SEMICONDUCTOR DEVICE

BACKGROUND

This disclosure relates generally to semiconductor manufacturing, and more particularly to a method to detect photoresist residue.

In semiconductor manufacturing a process called etching is used to remove material from or between layers in the semiconductor device to form paths, sometimes called vias. These vias can be filled with metal to connect different layers of the semiconductor device to each other. Problems arise when an etchant is blocked while forming a via, resulting in an uncompleted path when an attempt is made to fill the partially formed via with electrically conductive material.

A blocked etchant can occur due to problems associated with the etching process or problems associated with the lithography process. Etching process problems include particles being present or introduced into the etchant path, which can stop or delay the etchant so that the path is not completely formed. Lithography process problems include when photoresist is developed on a surface during the lithography process, removing photoresist to expose portions of the surface, and a photoresist residue is left on the exposed surface that can stop or delay the etchant so that the path or via is not completely formed.

It is difficult to detect when an etchant has been blocked, and as semiconductor technology progresses into the sub-micron level it becomes a problem to determine whether the cause of the blockage is rooted in the etching process or the lithography process. It is desirable to determine the cause of these blocked etches so that the problem can be corrected in order to improve manufacturing efficiencies such as wafer yield.

Accordingly, it would be desirable to provide an improved method for detecting photoresist residue absent the disadvantages found in the prior methods discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
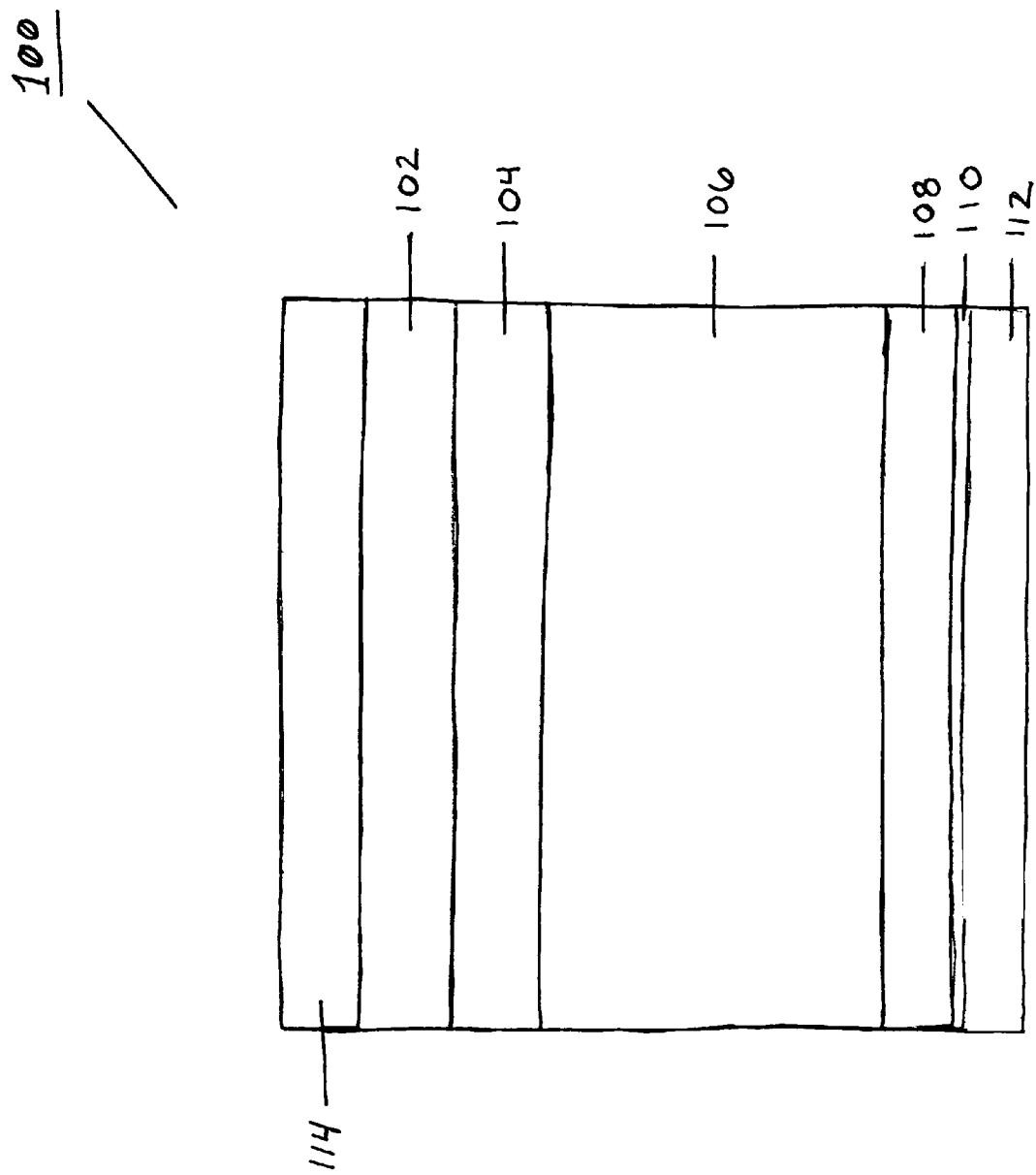
FIG. 1 is a cross sectional view illustrating a semiconductor device including a plurality of layers and a layer of photoresist on its surface.

In one embodiment, the manufacture of a semiconductor device 100, FIG. 1, includes a photolithography process. Device 100 includes a plurality of layers 102, 104, 106, 108, 110, and 112. The layers 102–112 include semiconductor substrate layers, insulator layers, and metal layers. Semiconductor substrate layer 112 can be made of many materials, including but not limited to Si, SiGe, SiC, and GaAs. Insulator layers can be made of many materials, including but not limited to $SiO_2$, $Si_3O_4$, and SiON. Metal layers can be made of many materials, including but not limited to Al, Al alloys, Cu, W, Ti, and Ta. A layer of photoresist 114 is applied to the surface of device 100 adjacent layer 102 as part of the photoresist patterning step of the photolithography process.

Figure 2:
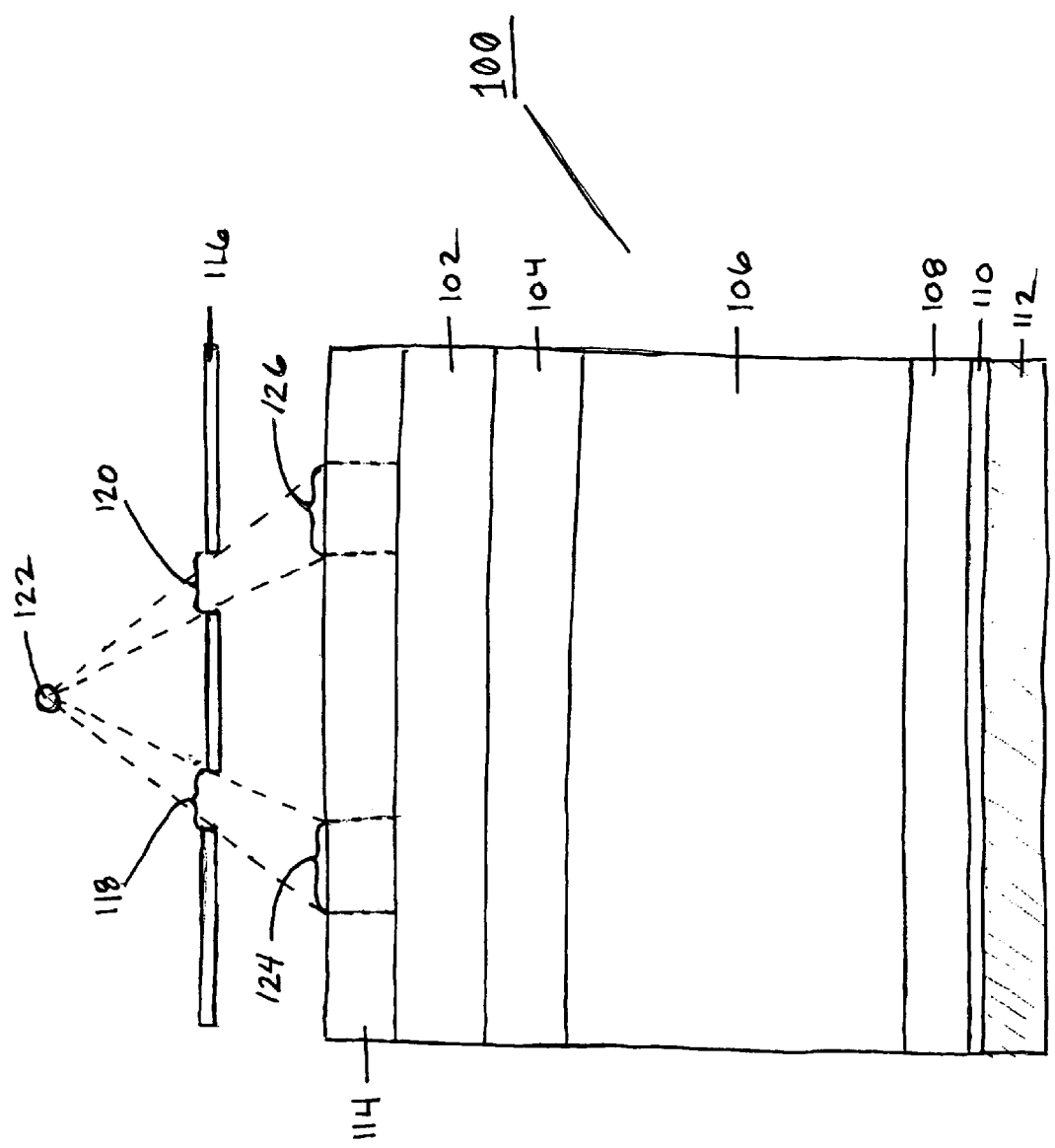
FIG. 2 is a cross sectional view illustrating a step in the photolithography process during the manufacture of a semiconductor device.

As the photoresist patterning step continues, FIG. 2, a mask 116 is laid over the photoresist 114. Mask 116 includes a pattern, represented by an opening 118 and 120 in the mask 116 in FIG. 2. A light 122, such as a high intensity ultraviolet light, is directed at mask 116. Light 122 passes through openings 118 and 120 and onto a section 124 and 126 on photoresist 114. Physical properties of sections 124 and 126 are changed by being exposed to light 122, and photoresist 114 is then developed to remove sections 124 and 126 from the surface of layer 102 on device 100. Alternative types of photoresist may be used for the lithography step such that development would remove sections of photoresist 114 from the surface of layer 102 on device 100 which had not been exposed to light 122.

Photoresist patterning includes processing steps such as photoresist coating, softbaking, mask aligning, pattern exposing, photoresist development, and hard baking using conventional photolithographic procedures of any suitable methods known in the art.

Figure 3:
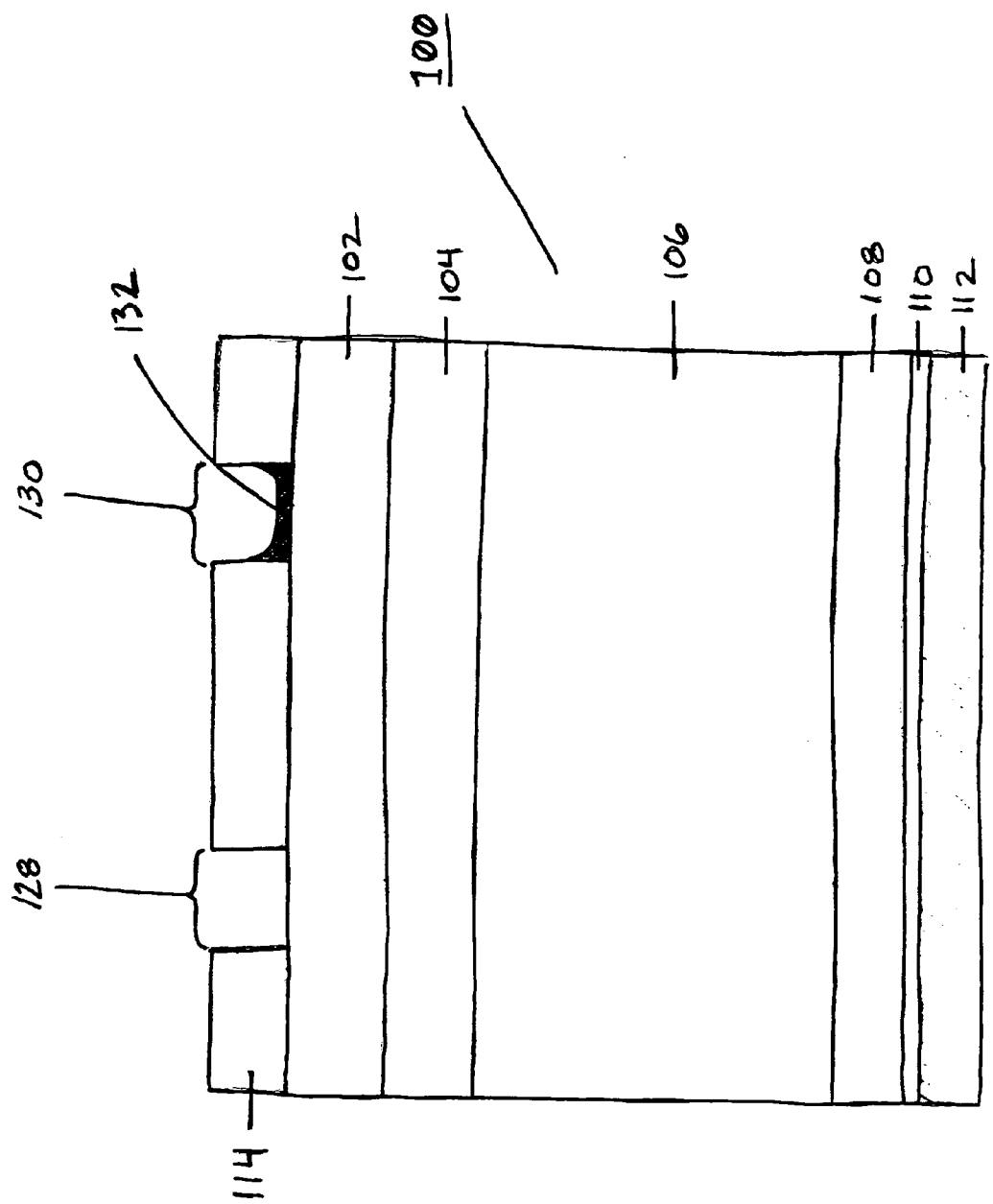
FIG. 3 is a cross sectional view illustrating a semiconductor device with a developed photoresist including photoresist residue on its surface.

After an ideal development of the photoresist 114, FIG. 3, device 100 has photoresist 114 with a recess 128 such that the surface of layer 102 is exposed. However, development of photoresist 114 may not be ideal, resulting in a recess 130 with a photoresist residue 132 on the surface of layer 102. As semiconductor technology progresses into the sub-micron level, conventional tools are not able to detect this photoresist residue that sits relatively deep in recess 130.

Figure 4:
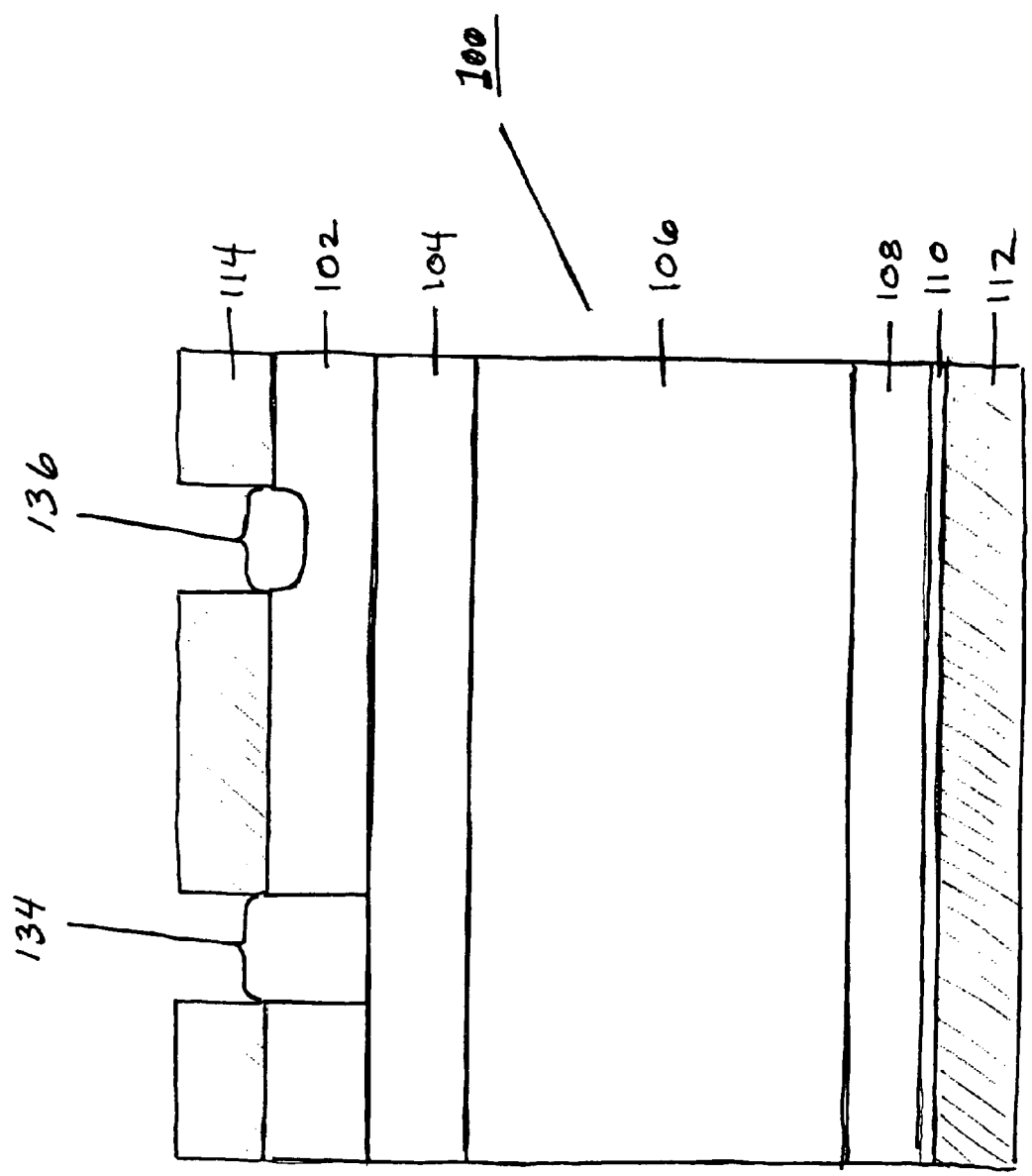
FIG. 4 is a cross sectional view illustrating a semiconductor device including partial etch paths.

To detect the presence of photoresist residue 132, a partial etch is conducted, FIG. 4. The etch is partial because it is not meant to connect layers in device 100, but rather it is only meant to reach a predetermined depth in the device for inspection purposes. The partial etch removes material from device 100, forming a partial etch path 134 and 136 through layer 102. Partial etch paths 134 and 136 are now inspected. Inspection can be conducted using a variety of physical failure analysis equipment, including but not limited to an optical microscope, a scanning electron microscope, a transmission electron microscope, a focus ion beam, a scanning auger microscope, secondary ion mass spectrometry, a spreading resistance probe, a scanning probe microscope, an auto decapsulation system, or tools such as a KLA-Tencor AIT XP. If no photoresist residue 132 was present on the surface of layer 102 before the partial etch, the result is partial etch path 134, which, in one embodiment, is etched to a depth on device 100 sufficient to expose the surface of layer 104. However, if photoresist residue 132 was present on the surface of layer 102 before the partial etch, the result is partial etch path 136, which, in one embodiment, is not etched to a depth on device 100 sufficient to extend completely through layer 102 and expose the surface of layer 104. Thus, inspection of the partial etch paths 134, 136 in layer 102 allows one to determine whether photoresist residue 132 was present after completion of a photolithography process. In another embodiment, the relative depths of partial etch paths may be compared to determine which partial etch paths, if any, are not at their desired depth due to photoresist residue present after the completion of a photolithography process. The desired depth of an etch path is determined by the manufacturer of the semiconductor device, and etch paths which are not of a desired depth may range from an unformed etch path to an etch path which is slightly less than the desired depth. Such inspection can be done during the semiconductor manufacturing process, allowing real-time monitoring of these defects.

Figure 5:
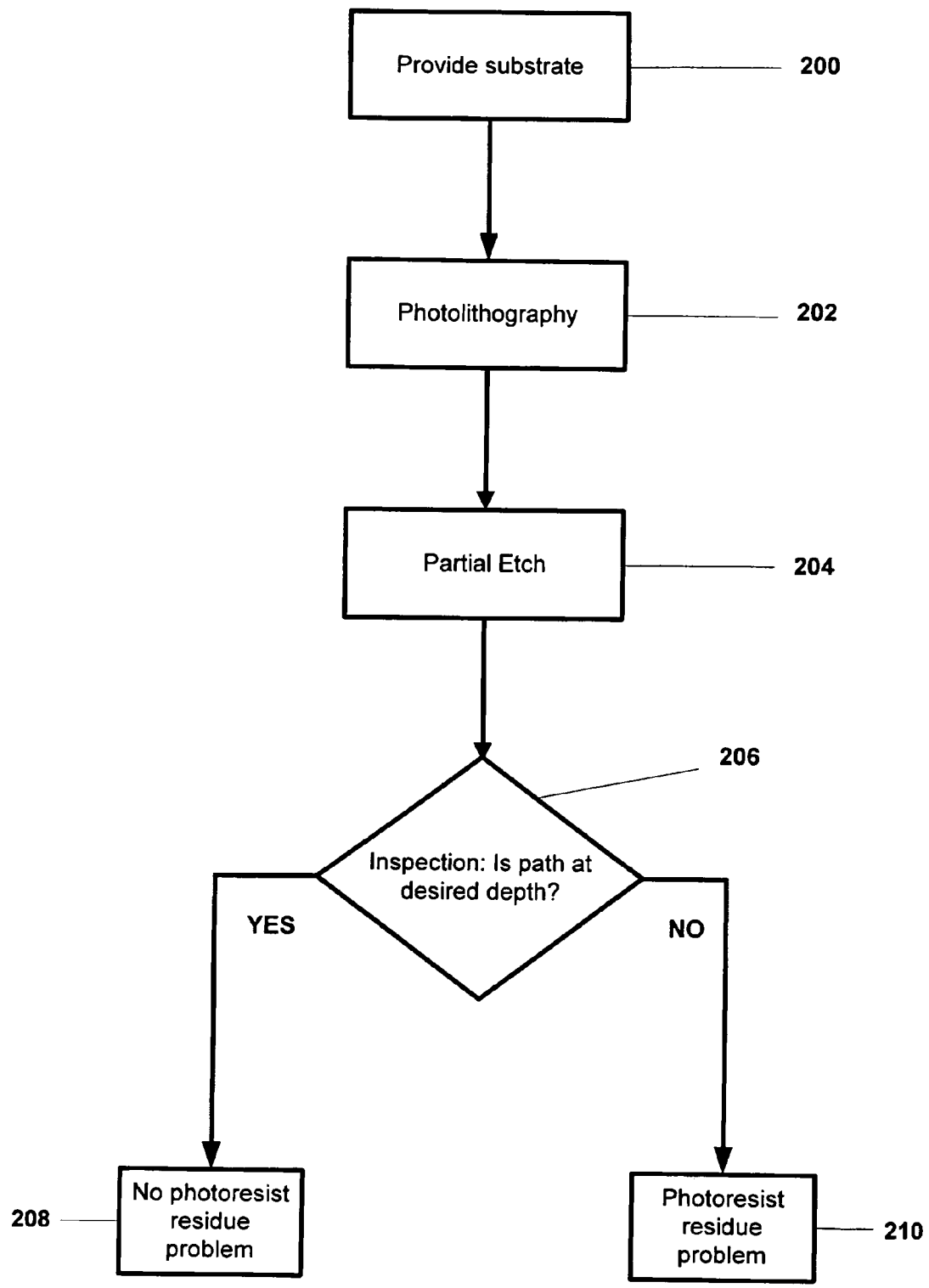
FIG. 5 is a flow chart illustrating an embodiment of the method.

A flowchart, FIG. 5, illustrates the steps of the method which includes providing a substrate 200, followed by a photolithography process 202 and a partial etch 204. A test is then conducted at decision block 206 to determine if the etch patch has reached a desired depth. If the etch path has reached a desired depth then process flow continues to block 208 at which it is recognized that there is no photoresist problem. However, if at decision block 206 it is determined that the etch path has not reached a desired depth, then process flow continues to block 210 at which it is recognized that there is a photoresist residue problem.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A method for detecting photoresist residue during semiconductor device manufacture comprising:
    patterning, by a photolithography process, a photoresist on a surface of the semiconductor device to expose portions thereof;
    partially etching a plurality of etch paths into the surface;
    optically inspecting the plurality of the etch paths; and
    determining the depths of the inspected etch paths;
    wherein optically inspecting the plurality of the partially etched paths uses real-time monitoring for detecting photoresist residue during semiconductor device manufacture and wherein determining the depths of the inspected etch paths indicates whether a blockage problem is directly caused by the photolithography process.

2. The method of claim 1 wherein the surface is a semiconductor substrate layer surface.

3. The method of claim 1 wherein the surface is a semiconductor insulator layer surface.

4. The method of claim 1 wherein the surface is a semiconductor metal layer surface.

5. The method of claim 1 wherein the etch paths are partial vias.

6. The method of claim 1 wherein the partial etch will result in etch paths of a first depth if there was no photoresist residue on the surface.

7. The method of claim 6 wherein the partial etch will result in etch paths of a second depth, less than that of the first depth, if there was photoresist residue on the surface.

8. The method of claim 1 wherein the plurality of etch paths are inspected using a microscope.

9. A method for detecting photoresist residue during semiconductor device manufacture comprising:
    providing a substrate with a surface;
    applying a photoresist to the surface;
    patterning, by a photolithography process, the photoresist on the surface of the semiconductor device to expose portions thereof;
    partially etching a plurality of etch paths into the surface;
    optically inspecting a plurality of the etch paths; and
    determining the depths of the inspected etch paths;
    wherein optically inspecting the plurality of the partially etched paths uses real-time monitoring for detecting photoresist residue during semiconductor device manufacture and wherein determining the depths of the inspected etch paths indicates whether a blockage problem is directly caused by the photolithography process.

10. The method of claim 9 wherein the surface is a semiconductor substrate layer surface.

11. The method of claim 9 wherein the surface is a semiconductor insulator layer surface.

12. The method of claim 9 wherein the surface is a semiconductor metal layer surface.

13. The method of claim 9 wherein the etch paths are partial vias.

14. The method of claim 9 wherein the etch paths are partial contacts.

15. The method of claim 9 wherein the partial etch will result in etch paths of a first depth if there was no photoresist residue on the surface.

16. The method of claim 15 wherein the partial etch will result in etch paths of second depth, less than that of the first depth, if there was photoresist residue on the surface.

17. The method of claim 9 wherein the plurality of etch paths are inspected using a microscope.

18. A method for detecting photoresist residue during semiconductor device manufacture comprising:
    applying photoresist to a surface of a semiconductor device;
    patterning, by a photolithography process, the photoresist on the surface of the semiconductor device to expose portions thereof;
    partially etching a plurality of etch paths into the surface;
    optically inspecting a plurality of the etch paths; and
    determining the depths of the inspected etch paths, whereby the etch paths will be a first depth if there is no photoresist residue on the surface, and the etch paths will be a second depth, less than that of the first depth, if there is photoresist residue on the surface;
    wherein optically inspecting the plurality of the partially etched paths uses real-time monitoring for detecting photoresist residue during semiconductor device manufacture and wherein determining the depths of the inspected etch paths indicates whether a blockage problem is directly caused by the photolithography process.

19. The method of claim 18 wherein the surface is a semiconductor substrate layer surface.

20. The method of claim 18 wherein the surface is a semiconductor insulator layer surface.

21. The method of claim 18 wherein the surface is a semiconductor metal layer surface.

22. The method of claim 18 wherein the etch paths are partial vias.

23. The method of claim 18 wherein the plurality of etch paths are inspected using a microscope.

* * * * *